(12) United States Patent  
Hwang

(10) Patent No.: US 6,995,047 B2  
(45) Date of Patent: Feb. 7, 2006

(54) THIN FILM TRANSISTOR HAVING A SHORT CHANNEL FORMED BY USING AN EXPOSURE MASK WITH SLITS

(75) Inventor: Kwang-Jo Hwang, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 28 days.

(21) Appl. No.: 10/125,541

(22) Filed: Apr. 19, 2002

(65) Prior Publication Data

US 2002/0153566 A1   Oct. 24, 2002

(30) Foreign Application Priority Data

Apr. 20, 2001   (KR) ............................... 2001-21463

(51) Int. Cl.  
    *H01L 21/84*   (2006.01)
(52) U.S. Cl. .................. 438/149; 438/30; 438/163; 438/942; 430/312; 430/313
(58) Field of Classification Search ........ 438/158–159, 438/161, 479, 482, 149, 163, 164, 942; 257/59, 257/72  
See application file for complete search history.

(56) References Cited

U.S. PATENT DOCUMENTS

| | | | | |
|---|---|---|---|---|
| 5,473,168 | A | * 12/1995 | Kawai et al. ................ | 257/61 |
| 5,610,737 | A | * 3/1997 | Akiyama et al. ............ | 349/47 |
| 5,656,824 | A | * 8/1997 | den Boer et al. ............ | 257/59 |
| 5,824,572 | A | * 10/1998 | Fukui et al. ................. | 438/158 |
| 5,872,370 | A | * 2/1999 | Gu et al. ..................... | 257/66 |
| 5,998,229 | A | * 12/1999 | Lyu et al. ..................... | 438/30 |
| 6,115,099 | A | * 9/2000 | Yamamoto et al. ......... | 349/178 |
| 6,284,576 | B1 | * 9/2001 | Ban et al. .................... | 438/149 |
| 6,395,586 | B1 | * 5/2002 | Huang et al. ............... | 438/149 |
| 6,429,058 | B1 | * 8/2002 | Colgan et al. .............. | 438/158 |
| 2002/0102855 | A1 | * 8/2002 | French et al. ............... | 438/694 |
| 2004/0051707 | A1 | * 3/2004 | Yamazaki et al. .......... | 345/204 |

OTHER PUBLICATIONS

Kim et al. ,"A Novel Four-Count Process Architecture for TFT-LCDs", SID 00 Digest, pp. 1006-1009.*

Liu et al.,"Conductivity Enhancement of Transparent Electrode by Side-Wall Copper Electroplating", SID 93 Digest, 1993, pp. 554-557.*

Han et al.,"A TFT manufactured by 4 masks process with new photolithography ", Asia Display 98, 1998, pp. 1109-1112.*

Ono et al., "A 24 cm Diagonal TFT-LCD Fabricated Using a Simplified, Four-Photolithographic Mask process", IEICE Trans. Electron., vol. E79-C, No. 8, 1996, pp. 1097-1102.*

* cited by examiner

*Primary Examiner*—Jerome Jackson  
*Assistant Examiner*—José R. Diaz  
(74) *Attorney, Agent, or Firm*—Birch, Stewart, Kolasch & Birch, LLP

(57) ABSTRACT

A mask containing apertures therein which is used for fabricating a channel of a thin film transistor (TFT), wherein the pixel charging time for a TFT in a high-resolution liquid crystal display (LCD) device is reduced by minimizing the length of the channel in the TFT when the active region is made of amorphous silicon. The length of the channel can be minimized by exposing light through the apertures is an exposure mask when forming the channel.

15 Claims, 6 Drawing Sheets

THIN FILM TRANSISTOR HAVING A SHORT CHANNEL FORMED BY USING AN EXPOSURE MASK WITH SLITS

BACKGROUND OF THE INVENTION

1. Field of the Invention

The present invention relates to a method for fabricating a thin film transistor (TFT) for a TFT liquid crystal display (hereinafter, referred to as a TFT-LCD) device and in particular, to a method for fabricating a TFT, which allows the amount of charge current supplied to the pixels to be increased. This is achieved by fabricating a channel of a TFT formed at an amorphous silicon active region so that its length is not greater than 4 μm. The channel according to the present invention is formed by using a mask having slits or other slit-type openings.

2. Description of the Background Art

In high resolution TFT-LCD devices, due to the TFT structure having gate electrodes with narrow widths, the amount of charge current supplied to the pixels via the TFT is relatively small and a relatively longer charging time is required compared to low resolution TFT-LCD devices. In a typical TFT, where an amorphous silicon is used for an active region, there are limits to improving the mobility of the electric charges because the mobility does not generally exceed 0.6 cm/Vs for amorphous silicon. Thus, to improve the mobility of electric charges, the length of the channel (formed between the source and drain regions, and above the gate electrode) has to be shortened. However, because the fabrication process of a TFT-LCD is performed on a substrate having a large surface area, it is not easy to apply conventional semiconductor fabrication techniques for TFT-LCD fabrication requiring a short length channel. For example, it is difficult to form a uniform photoresist and to properly perform photolithography on a large substrate area to obtain a short length channel.

For defining a channel region according to the conventional art, a conventional light transmittance mask (i.e., exposure mask) is used by relying upon the resolution of an exposure device. The method for fabricating a TFT according to the conventional art will be described in detail with reference to accompanying drawings.

FIGS. 1A–1D are sectional views sequentially illustrating the method for fabricating a TFT according to the conventional art.

As a first step (FIG. 1A), a gate electrode 2 is formed on a glass substrate 1, and a gate insulating layer 3, an amorphous silicon 4, and an n$^+$ amorphous silicon 5 having a high density n-type ions injected therein are sequentially formed thereon. Then, patterning of the n$^+$ amorphous silicon 5 and the amorphous silicon 4 is achieved by a photolithography process to form an active region above the gate insulting layer 3 corresponding to the upper portion of the gate electrode 2.

As a second step (FIG. 1B), a source 6A and a drain 6B are formed by depositing a metal on the upper surface of the above structure in FIG. 1A and then patterned to form respective portions separated by a certain distance from the center portion of the n$^+$ amorphous silicon 5. The source and drain 6A, 6B extend over the end portions of the amorphous silicon 4 and the n$^+$ amorphous silicon 5, and onto a portion of the gate insulating layer 3. Here, portions of the n$^+$ amorphous silicon 5 exposed between the source and drain portion 6A, 6B, and an upper portion of the amorphous silicon 4 are etched to define a channel region.

As a third step (FIG. 1C), a passivation layer 7 is deposited onto the structure of FIG. 1B and a contact hole is formed through a portion of the passivation layer 7 using a photolithography process to expose an upper portion of the drain 6B.

As a fourth step (FIG. 1D), an ITO (Indium Tin Oxide) thin film 8 is deposited onto the structure of FIG. 1C and then patterned to form a pixel being connected with the exposed drain 6B.

Hereinafter, the method for fabricating a TFT in accordance with the conventional art will be described in more detail.

First, as depicted in FIG. 1A, a metal is deposited onto the upper portion of the glass substrate 1, a photoresist is coated on the upper portion of the metal, the photoresist coated on the upper portion of the metal is exposed and developed to form a photoresist pattern. The gate electrode 2 is formed by etching the metal by an etching process using the photoresist pattern as an etching mask, and the photoresist pattern is removed. Then, the insulating layer 3, the amorphous silicon 4 and the n$^+$ amorphous silicon 5 are sequentially deposited on the above structure. A photoresist is coated onto the upper surface of the n$^+$ amorphous silicon 5, then exposed and developed (using an exposure mask) to form a photoresist pattern at portions opposing the upper and surrounding areas of the gate electrode 2. Next, an active region is formed at the upper and surrounding areas of the gate electrode 2 by patterning the n$^+$ amorphous silicon 5 and the amorphous silicon 4 using an etching process employing the photoresist pattern as an etching mask, and the photoresist pattern is then removed using a wet etchant, etchant gas or the like.

As depicted in FIG. 1B, a metal is deposited onto the structure of FIG. 1A, and then a photoresist is coated thereon. After forming a photoresist pattern upon exposure and development, the metal is etched using an etching process employing the photoresist pattern as an etching mask to form a source 6A and a drain 6B which are respectively separated by a certain distance above the center portion of the n$^+$ amorphous silicon 5 and formed onto a portion of the gate insulating layer 3 at the sides of the active region.

Then the above etching process is continued so that portions of the n$^+$ amorphous silicon 5 exposed between the source and drain 6A, 6B, and an upper portion of the amorphous silicon 4 under the n$^+$ amorphous silicon 5 are etched to define a channel region.

Here, the etching mask that is used allows light to pass through to the channel region and to the regions adjacent to the source and drain 6A, 6B. For example, the mask can have light blocking portions 10 and light transmitting portions 20 as shown in FIG. 2, wherein the light blocking portions 10 block light from reaching the source and drain 6A, 6B. It can be understood that the light intensity and diffraction amount for the light passing through each of the light transmitting portions 20 formed in the mask is relatively equivalent, as shown in the graph of FIG. 2.

The minimum line length of the channel region that can be formed by the conventional etching mask depends on the resolution of the exposure device. However, using conventional techniques, it is currently impossible or at least very difficult to properly form photoresist patterns having a line length of less than 4 μm, and thus the channel to be formed under the photoresist pattern cannot have a length of less than 4 μm. The reason for this is because when the light transmittance region of the etching mask is less than 4 μm in size, the distribution for the amount of exposed light passing through the conventional etching mask is undesirably spread out and the etched portions are thus not sharply defined. As a result, portions of undesired photoresist may remain (i.e., the photoresist is not properly etched) due to overlapping of adjacent photoresist pattern portions, and thus the desired overall photoresist pattern may not be properly formed using conventional art techniques.

Next, as depicted in FIG. 1C, the passivation layer 7 is deposited onto the upper surface of the structure of FIG. 1B, and an upper portion of the drain 6B is exposed by forming a contact hole through the passivation layer 7 using a photolithography process.

Finally, as depicted in FIG. 1D, a pixel contacting the exposed drain 6B is formed by depositing an ITO thin film 8 at the upper surface of the structure of FIG. 1C and the patterning thereof is performed by a photolithography process.

SUMMARY OF THE INVENTION

The present invention involves the recognition by the present inventors of the problems in the conventional art. Namely, the conventional art method for fabricating a TFT for a TFT-LCD device is problematic in that the formation of the channel region length depends only upon the resolution of the exposure device. Conventional exposure devices and conventional TFT fabrication techniques do not allow the channel region to be formed to be less than 4 μm in length. Thus, when the gate width of each TFT in high resolution LCD devices is decreased in size so that a greater number of TFTs can be formed, the amount of charge current being supplied for charging the pixels of the TFTs is relatively decreased as well, due to the smaller gate widths. Due to the smaller current being supplied to the pixels, the overall pixel charging time is undesirably delayed. This can be prevented by improving the mobility of electrical charges, which is achieved by shortening the length of the channel when the active region of a TFT is made of amorphous silicon.

Accordingly, it is an object of the present invention to provide a method for fabricating a TFT, which is capable of forming a channel having a length less than 4 μm, which is particularly desirable for manufacturing high resolution TFT-LCDs.

To achieve the above object, the method of the present invention includes the steps of forming a gate electrode on an upper portion of a glass substrate and forming an active region over an upper portion of the gate electrode and the part of the upper portion of the glass substrate; forming a channel region by depositing a metal onto the upper portion of the active region, forming a source and a drain region on each right and left upper portion of the active region by patterning the metal by a photolithography process, and etching a part of the upper portion of the active region between the source and drain; and forming a pixel contacting the drain by depositing a passivation layer on the upper surface of the structure and exposing the part of the drain by forming a contact hole in the passivation layer, wherein the photolithography process for forming the source, drain and channel regions allows a channel region having a length of 1~4 μm to be formed by using a silt type mask having slits (slots, openings, etc.) thereon that are positioned to correspond with the channel region to be formed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

A method for fabricating a TFT for a TFT-LCD device in accordance with the present invention includes forming a gate electrode at the upper portion of a glass substrate and forming an active region at an upper portion of the gate electrode and a part of the upper portion of the glass substrate; forming a channel region by depositing a metal onto the upper portion of the active region, forming a source and a drain region on each right and left upper portion of the active region by patterning the metal by a photolithography process, and etching a part of the upper portion of the active region between the source and drain region; and forming a pixel contacting the drain by depositing a passivation layer on the upper surface of the structure and exposing a part of the drain by forming a contact hole on the passivation layer. The source, drain and channel regions are formed by a photolithography process using a slit type mask having a slit thereon positioned to correspond with the channel region to be formed. The above features will be described in more detail with reference to the accompanying drawings.

Figure 3A:
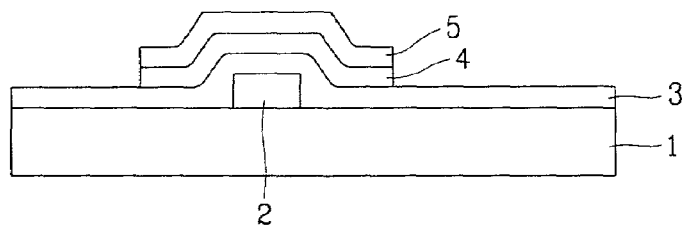
FIGS. 3A–3E are sectional views illustrating a method for fabricating a TFT in accordance with the present invention.

FIGS. 3A–3E are sectional views illustrating fabrication processes of a TFT in accordance with the present invention. The method in accordance with the present invention includes the following steps. A first step (FIG. 3A) involves forming a gate electrode 2 on a glass substrate 1, then depositing an insulating layer 3, an amorphous silicon layer 4 and a n⁺ amorphous silicon layer 5 injected with high density n-type ions sequentially thereon, and then patterning the n⁺ amorphous silicon 5 and the amorphous silicon 4 by performing a photolithography process. In a second step (FIG. 3B) the structure of FIG. 3A is coated with a metal 9 and a photoresist PR, then using a mask having a slit portion corresponding to a central region of the active region to expose and develop portions of the photoresist PR. In a third step (FIG. 3C) the photoresist PR is used as an etching mask to pattern the metal 9 by an etching process to form a source 6A and a drain 6B region which are respectively separated by a certain distance above the center portion of the n+ amorphous silicon 5 and formed onto a portion of the gate insulating layer 3 at the sides of the active region, and then the n+ amorphous silicon 5 exposed between the source 6A and drain 6B, and an upper portion of the amorphous silicon 4 disposed under the n+ amorphous silicon 5 are etched to define a channel region having a size of less than 4 μm. A fourth step (FIG. 3D) is performed by depositing a passivation layer 7 onto the upper surface of the structure of FIG. 3C, and an upper portion of the drain 6B is exposed by forming a contact hole through the passivation layer 7 using a photolithography process. A fifth step (FIG. 3E) is performed by forming a pixel contacting the exposed drain 6B by depositing an ITO thin film 8 on the upper surface of the structure of FIG. 3D and patterning it with a photolithography process.

Hereinafter, the method for fabricating a TFT in accordance with a first embodiment of the present invention will be described in more detail.

First, as depicted in FIG. 3A, the gate electrode 2 is formed by depositing a metal onto the upper portion of the glass substrate 1 and pattering the metal by a photolithography process.

Next, the insulating layer 3, the amorphous silicon layer 4, and the n+ amorphous silicon layer 5 injected with high density n-type ions are sequentially deposited onto the upper surface of the glass substrate 1 having the gate electrode 2 formed thereon. The n+ amorphous silicon 5 and the amorphous silicon 4 are patterned by a photolithography process to define an active region at portions above and around the gate electrode 2 and over portions of the insulating layer 3.

Figure 3B:
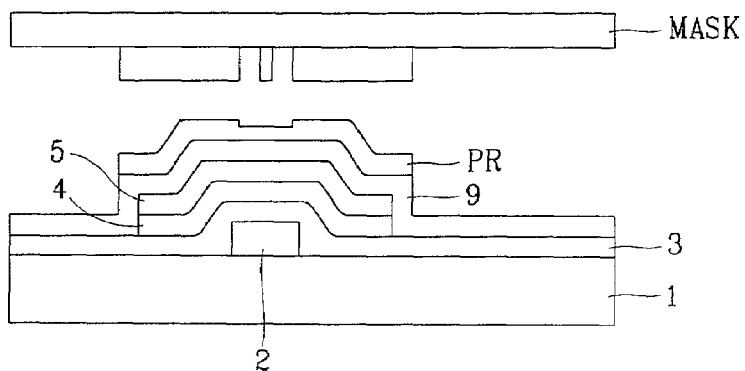

Then, as depicted in FIG. 3B, a metal 9 is deposited onto the upper portion of the structure of FIG. 3A, and the photoresist PR is coated onto the upper portion of the metal 9.

Figure 1A:
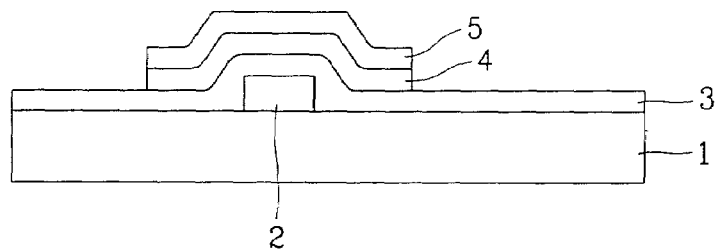
FIGS. 1A–1D are sectional views illustrating a method for fabricating a TFT in accordance with the conventional art.
Figure 1B:
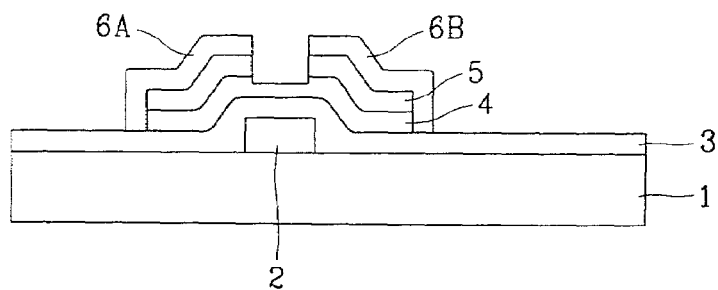
Figure 1C:
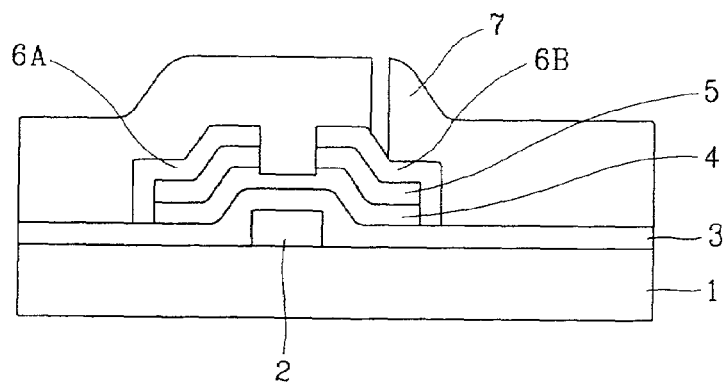
Figure 1D:
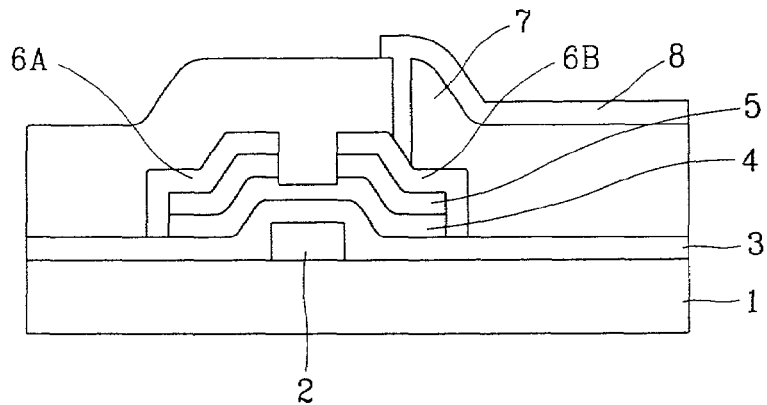
Figure 2:
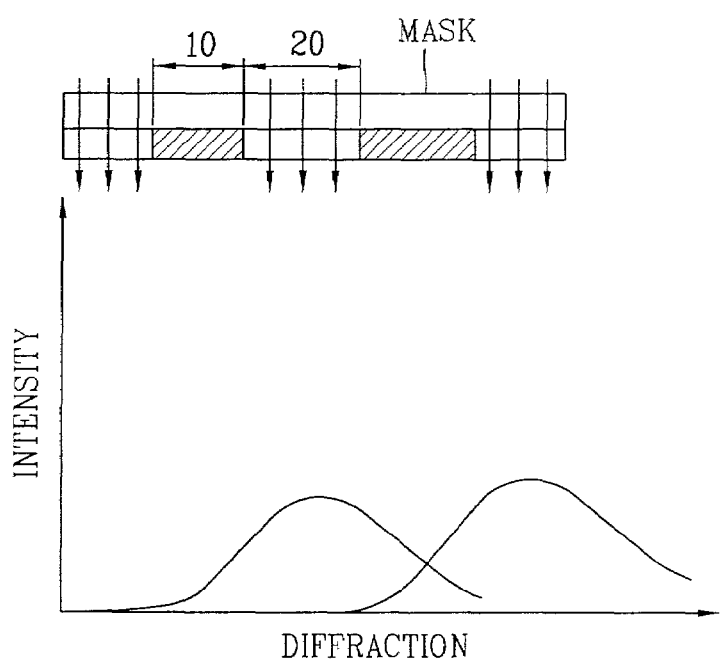
FIG. 2 illustrates the conventional mask for forming a source, a drain and a channel region and a graph illustrating an intensity of light transmitted through portions of the mask.
Figure 4:
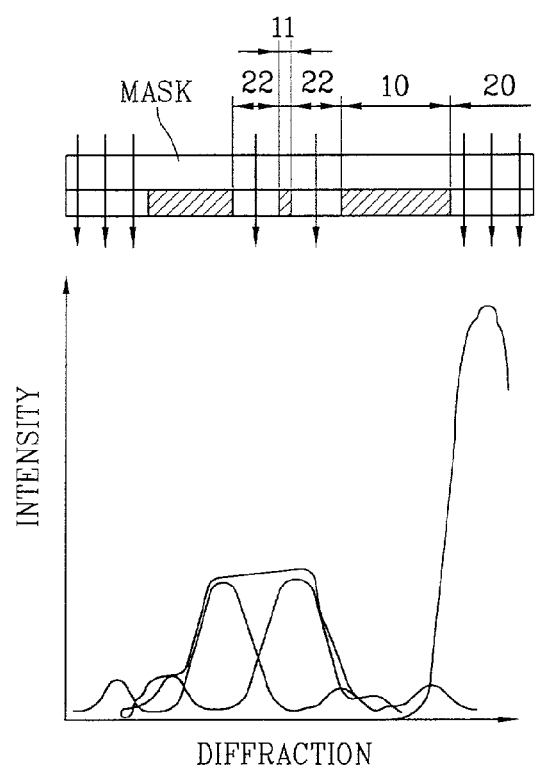
FIG. 4 illustrates a mask in accordance with the present invention and a graph illustrating an intensity of light transmitted through portions of the mask.

FIG. 4 illustrates a detailed structure of the mask and a graph showing the intensity of light being transmitted through the mask according to the present invention. The mask has light blocking portions 10 and light transmitting portions 20, as in the conventional art masks. But, the mask of the present invention has a particular configuration for the light transmitting portion corresponding to where a channel is to be formed. Namely, at least one light blocking portion 11 and a plurality of light transmitting portions 22 form an opening having at least two slits (or slots, slit-type openings, etc.), as shown in FIG. 4. The light blocking portion 11 blocks portions of light that would otherwise pass freely through the light transmitting portion 20 of the conventional art mask shown in FIG. 2. Accordingly, the intensity of the light transmitted by the mask of the present invention provides an improved exposure definition (e.g. line length formation accuracy) as evidenced by the steep slopes in the graph of FIG. 4, compared with the light intensity spread having gradual slopes as shown in FIG. 2. Here, it should be noted that the actual shape of the openings in the mask portion above where the channel is to be formed is not limited to slits. Various other shapes may be employed as long as the light transmitted therethrough allows an improved exposure definition to be achieved. As such, slots or other slit-type shapes may be employed to achieve the same results of improved exposure definition.

When light is irradiated onto the photoresist PR by using the mask of FIG. 4, light with relatively high energy is applied onto the portions of the photoresist through the light transmitting portions 20 so that these photoresist portions are completely removed by the developing solution applied after exposure. In contrast, the channel region receives light with relatively low energy because of the blockage created by the light blocking portion 11 (where light can only pass through the slits, i.e., light transmitting portions 22) so that the photoresist over the channel region are only partially removed by the developing solution applied after exposure, such that a uniform layer of photoresist remains above the channel region.

In other words, the channel formation according to the conventional art causes over-exposure of the photoresist at a center portion of the channel with undesired photoresist material remaining at the walls of the channel to be formed, while the channel formation according to the present invention sharply defines the walls of the channel to be formed with no over-exposure of the photoresist at a center portion of the channel to be formed. This allows more accurate removal of the photoresist in subsequent steps so that the resulting channel configuration has a length of less than 4 μm.

After the photoresist PR is irradiated using the mask of FIG. 4 having slits as explained in the manner above, the exposed photoresist PR is developed with a developing solution.

Figure 3C:
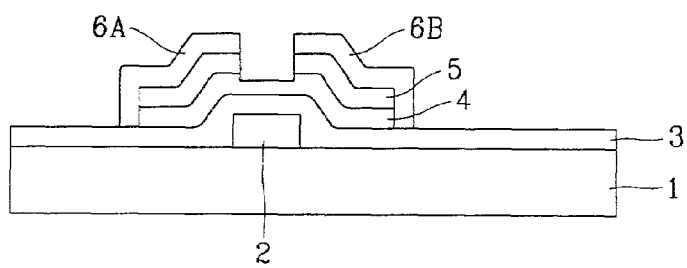

Next, as depicted in FIG. 3C, the metal 9 is patterned by an etching process using the photoresist PR as an etching mask to thus form a separate source 6A and a separate drain 6B on the n+ amorphous silicon 5 and on portions of the insulating layer 3 adjacent to the sides of the active region.

Here, portions of the metal 9 that are exposed without any photoresist PR pattern thereon (such as the metal 9 portions on the insulating layer 3) are etched first. Then, the portions above the channel to be formed are etched because of the remaining uniform photoresist portions created by light exposure through the slits of the mask of FIG. 3B. As the photoresist over the source 6A and drain 6B are thicker than the uniform photoresist over the channel region, etching thereof occurs after the photoresist above the channel is etched. The etching process is conducted in a manner such that the central portions of 5 is completely etched, while only the upper, central portion of 4 is etched to define the channel. As the channel is being defined, the photoresist over the source 6A and drain 6B are completely etched away. Thus, the structure of FIG. 3C is obtained.

Figure 3D:
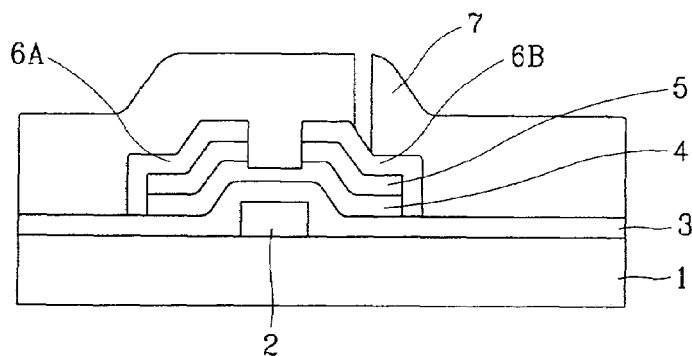

Thereafter, as depicted in FIG. 3D, a passivation layer 7 is deposited onto the structure of FIG. 3C, and a portion of the drain 6B is exposed by forming a contact hole through the passivation layer 7 using a photolithography process.

Figure 3E:
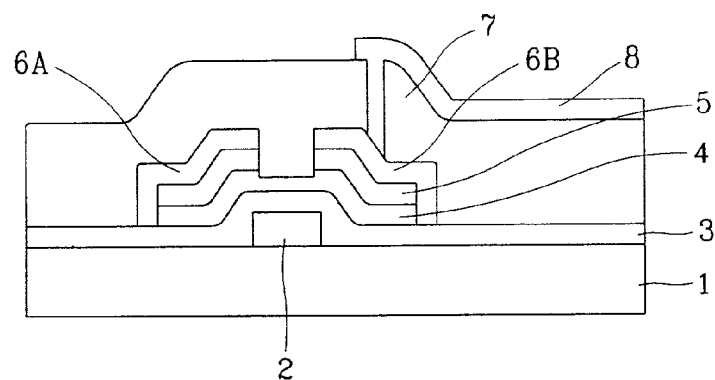

Finally, as depicted in FIG. 3E, a pixel contacting with the partially exposed drain 6B is formed by depositing and patterning an ITO thin film 8 onto the structure of FIG. 3D.

Regarding the formation of the channel, when considering the conventional margin of error range for an exposure process used in fabricating TFT-LCDs, it is difficult to form a channel having a length of less than 1 μm. In practice, forming a channel having a length in the range of 1 μm~4 μm is more feasible and realistic according to the present invention. More preferably, the channel length should be within the range of 2 μm~3 μm to accommodate a margin of error during fabrication and to maximize the semiconductor characteristics of the channel region of a TFT. However, as semiconductor fabrication techniques continue to evolve and further improve in the future, it can be foreseen that the present invention technique of employing a mask with slits (slots, slit-type openings, etc.) that provide a controlled transmittance of light or energy irradiation onto the channel region may also be implemented with more advanced semiconductor fabrication technologies under current or future development.

The TFT manufacturing steps of FIGS. 3A–3E described above are sometimes referred to a so-called "5-mask" process. Namely, five masks are used to fabricate the various portions of the TFT. For example, a mask is used for forming the gate electrode, forming the active region, forming the channel, source and drain regions, forming the hole in the passivation layer, and forming the pixel electrode. Typically, a "4-mask" process uses only four masks. The masks that are used are similar to those used in the 5-mask process, but only a single mask is employed for forming the active region, the channel, the source, and the drain. The method of the present invention can also be applied to a so-called "4-mask" process described below with reference to FIGS. 5A–5E.

Figure 5A:
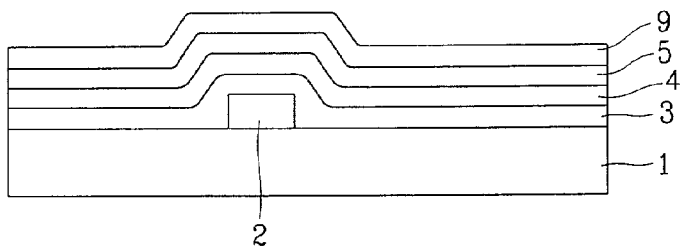
FIGS. 5A–5E show another embodiment of the present invention.

FIGS. 5A–5E show another embodiment of the present invention. In FIG. 5A, a metal is deposited onto a glass substrate 1, which is then patterned by a photolithography process to form a gate electrode 2. Then, over the glass substrate 1 having the gate electrode 2 thereon, an insulating layer 3, an amorphous silicon 4, and a n⁺ amorphous silicon 5 injected with high density n-type ions are sequentially deposited.

Figure 5B:
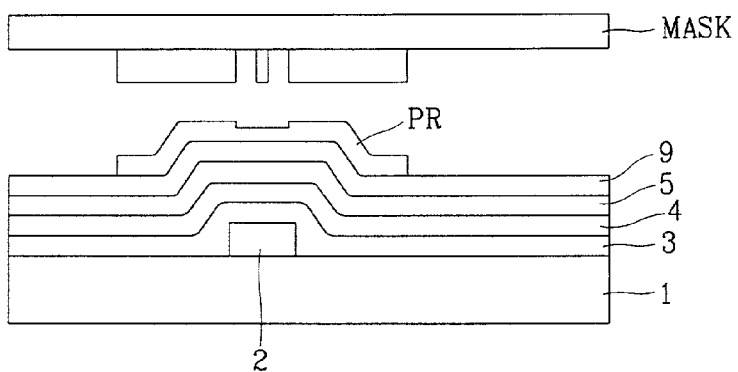

Thereafter, as shown in FIG. 5B, a photoresist PR is coated over the structure of FIG. 5A, and light is irradiated through a mask such as the one shown in FIG. 4 to form a photoresist pattern. Then, for the photoresist pattern portions above the gate electrode 2, diffraction light rays are applied thereto using an appropriate irradiation device for reducing the photoresist thickness compared to the other portions of the photoresist pattern covering the remaining portions other than above the gate electrode 2. Here, the photoresist portions with a reduced thickness will be referred to as the "thinned photoresist" portions.

Figure 5C:
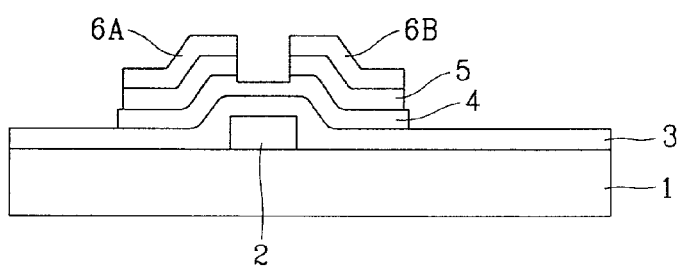

Then as shown in FIG. 5C, portions of the stacked layer structure comprising the metal 9, the n⁺ amorphous silicon 5, and the amorphous silicon 4 that are not covered by the photoresist PR are etched away until the gate insulating layer 3 thereunder is exposed. At the same time, portions of the metal 9, the n⁺ amorphous silicon 5, and the amorphous silicon 4 underlying the "thinned photoresist" portions are selectively etched away. Etching of the metal 9 results in the formation of a source 6A and a drain 6B. The complete etching of the n⁺ amorphous silicon 5, and the partial etching of the amorphous silicon 4 result in the formation of a channel having a length of less than 4 µm.

Figure 5D:
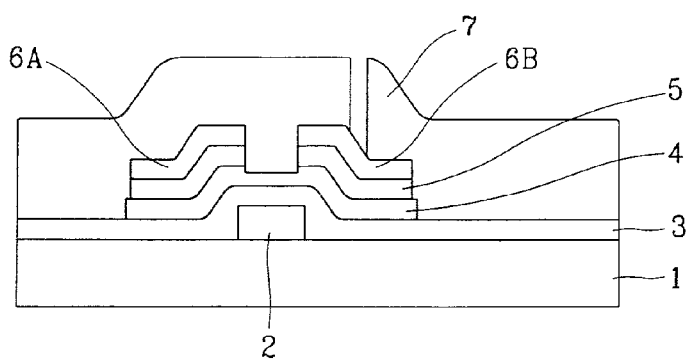
Figure 5E:
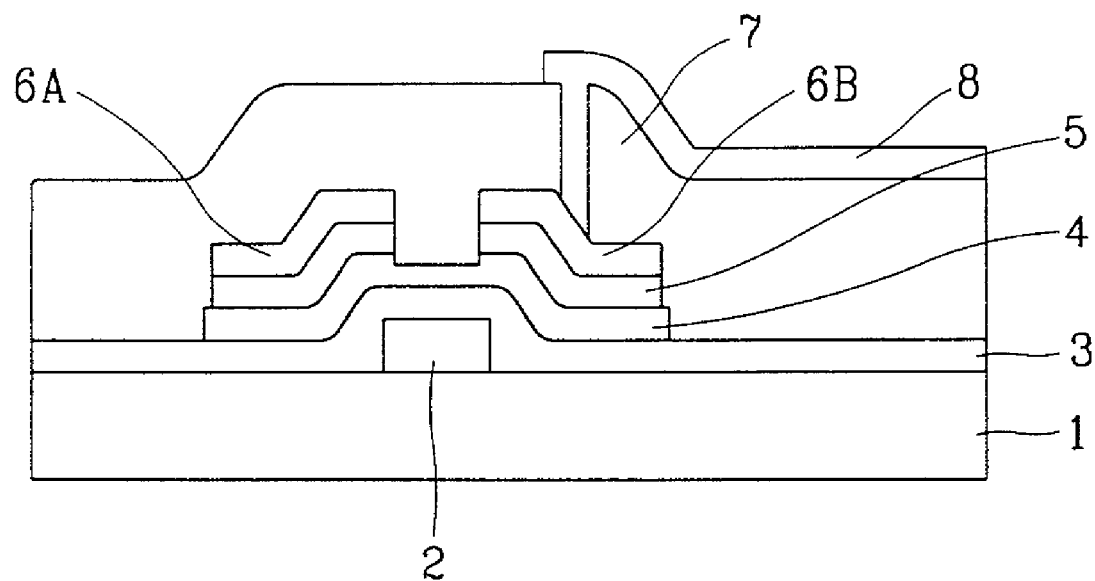

As shown in FIG. 5D, a passivation layer 7 is deposited over the structure of FIG. 5C, and a contact hole is formed through a portion of the passivation layer 7 to expose an upper portion of the drain 6B. Finally, as shown in FIG. 5E, an ITO thin film 8 is deposited over the structure of FIG. 5D, and then patterned to form a pixel that is connected with the drain 6B.

Accordingly, the techniques of the present invention according to the first embodiment employing a "5-mask" process can also be applied to a "4-mask" process described above. By doing so, manufacturing costs can be further reduced and the fabrication steps can be further simplified as compared to those of the "5-mask" process.

As described above, the method for fabricating the TFT for a TFT-LCD device in accordance with the present invention allows a channel to be formed with a length of less than 4 µm by employing a slit type mask. Irradiation through the slit type mask onto a channel region effective prevents the distribution for the amount of exposed light passing through the etching mask from undesirably spreading out, which thus allows the etched channel portions to be sharply defined. Unlike the conventional art, which solely relies upon the resolution of an exposure device, the present invention modifies the mask structure to have slits, slots, or other slit-type openings to prevent undesirable spreading of light passing through the portion of the mask above the channel region to be formed. Accordingly, as the channel of a TFT can be formed to have a length of less than 4 µm, the amount of charge current supplied to the pixels via the TFT formed by the present invention method can be increased.

This specification describes various illustrative embodiments of a method and structure of the present invention. The scope of the claims is intended to cover various modifications and equivalent arrangements of the illustrative embodiments disclosed in the specification. Therefore, the following claims should be accorded the reasonably broadest interpretation to cover modifications, equivalent structures, and features that are consistent with the spirit and scope of the invention disclosed herein.

What is claimed is:

1. A method for fabricating a thin film transistor (TFT) for a liquid crystal display (LCD) device comprising the steps of:
   forming a gate electrode on a glass substrate and forming an active region above the gate electrode;
   forming a channel region by depositing a metal onto the active region, thereby forming a source and a drain on each end of the active region by patterning the metal using a photolithography process and etching an upper portion of the active region between the source and drain; and
   forming a pixel electrode which electrically contacts the drain by depositing a passivation layer on the upper surface of the structure and exposing a part of the drain by forming a contact hole through the passivation layer,
   wherein the photolithography process employs a slit type mask comprising:
   a slit formed between adjacent first and second light-shielding portions, and
   third light shielding portion centered in the slit;
   wherein the slit is positioned to correspond to the position of the channel region, which forms the channel region having a length less than 4 µm, but at least 1 µm.

2. The method of claim 1, wherein the slit type mask has a total transmittance region transmitting all light at the channel region and a plurality of light shielding regions formed spaced apart from each other at the lower portion of the total transmittance region and cut off light.

3. The method of claim 1, wherein the channel region is formed to have a length of 2 µm to 3 µm.

4. The method of claim 1, wherein the steps are performed by using five exposure masks.

5. The method of claim 1, wherein the steps are performed by using four exposure masks.

6. A method for fabricating a thin film transistor (TFT) comprising for liquid crystal display (LCD) device the steps of:
   forming a gate electrode on a substrate;
   forming an active region above the gate electrode;
   forming a source and a drain above the active region;
   forming a channel at the active region between the source and the drain by exposing a portion of the active region with high intensity light energy passing through a slit of a slit-type mask having the slit positioned to correspond to the channel to be formed to obtain a channel length less than 4 µm, the slit being formed between adjacent first and second light-shielding portions, the slit-type mask including a third light shielding portion centered in the slit; and forming a pixel electrode electrically connected with the drain so that charge current from the gate electrode can be supplied to a pixel via the channel.

7. The method of claim 6, wherein the step of forming the active region further comprises:
   forming a gate insulating layer on the gate electrode and the substrate;
   selectively forming a first silicon layer on a portion of the gate insulating layer above the gate electrode;
   forming a second silicon layer on the first silicon layer to obtain a first intermediate structure;
   forming a metal layer on the first intermediate structure; and
   selectively forming a photoresist on a portion of the metal layer.

8. The method of claim 7, wherein the step of forming the channel further comprises: etching the metal layer, the second silicon layer, and the first silicon layer by using the slit-type mask to obtain a second intermediate structure with a source, a drain, and a channel defined.

9. The method of claim 8, wherein the step of forming the pixel electrode further comprises:
   forming a passivation layer on the second intermediate structure, the passivation layer exposing a portion of the drain; and
   forming a pixel electrode on a portion of the passivation layer, the pixel being electrically connected with the drain.

10. The method of claim 6, wherein the channel region is formed to have a length of 2 $\mu$m to 3 $\mu$m.

11. The method of claim 6, wherein the step of forming the active region further comprises:
    forming a gate insulating layer on the gate electrode and the substrate;
    forming a first silicon layer on the gate insulating layer;
    forming a second silicon layer on the first silicon layer;
    forming a metal layer on the second silicon layer; and
    forming a photoresist on a portion of the metal layer above the gate electrode.

12. The method of claim 11, wherein the step of forming the channel further comprises: etching the metal layer, the second silicon layer, and the first silicon layer by using the slit-type mask to obtain a second intermediate structure with a source, a drain, and a channel defined.

13. The method of claim 12, wherein the step of forming the pixel electrode further comprises:
    forming a passivation layer on the second intermediate structure, the passivation layer exposing a portion of the drain; and
    forming a pixel electrode on a portion of the passivation layer, the pixel being electrically connected with the drain.

14. The method of claim 6, wherein the channel region is formed to have a length of 2 $\mu$m to 3 $\mu$m.

15. A method for fabricating a thin film transistor (TFT) for a liquid crystal display (LCD) device the steps of:
    forming a gate electrode on a substrate;
    forming an active region above the gate electrode;
    forming a source and a drain above the active region;
    forming a channel at the active region between the source and the drain by exposing the portion of the active region where the channel is to be formed with light energy passing through apertures in a mask which are effective in shortening the length of the channel to less than 4 $\mu$m by positioning the apertures directly above the channel to be formed and providing a controlled transmission of light or energy radiation onto the portion of the active region where the channel is to be formed, wherein the mask includes:
    an opening formed between adjacent first and second light-shielding portions, and;
    a third light shielding portion centered in the opening, the third light shielding portion being between two of the apertures; and
    forming a pixel electrode electrically connected with the drain so that charge current from the gate electrode can be supplied to the pixel via the channel.

* * * * *